US012568791B2

(12) United States Patent
Baryshnikov et al.

(10) Patent No.:  US 12,568,791 B2
(45) Date of Patent:          Mar. 3, 2026

(54) CONTROLLING CONCENTRATION PROFILES FOR DEPOSITED FILMS USING MACHINE LEARNING

(71) Applicant: Applied Materials, Inc., Santa Clara, CA (US)

(72) Inventors: Anton V Baryshnikov, Campbell, CA (US); Aykut Aydin, Sunnyvale, CA (US); Zubin Huang, Santa Clara, CA (US); Rui Cheng, San Jose, CA (US); Yi Yang, San Jose, CA (US); Diwakar Kedlaya, San Jose, CA (US); Venkatanarayana Shankaramurthy, San Jose, CA (US); Krishna Nittala, San Jose, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 335 days.

(21) Appl. No.: 18/068,467

(22) Filed: Dec. 19, 2022

(65) Prior Publication Data

US 2023/0118964 A1      Apr. 20, 2023

Related U.S. Application Data

(63) Continuation of application No. 17/191,026, filed on Mar. 3, 2021, now Pat. No. 11,532,525.

(51) Int. Cl.
H01L 21/67 (2006.01)
(52) U.S. Cl.
CPC .. H01L 21/67253 (2013.01); H01L 21/67248 (2013.01)

(58) Field of Classification Search
CPC .............. H01L 21/67248; H01L 22/26; H01L 21/67253; G05B 13/0265; G05B 13/048; G05B 15/02
(Continued)

(56) References Cited

U.S. PATENT DOCUMENTS 5,862,057 A * 1/1999 Xia ................... H01L 21/02274
                                                        438/646
6,159,758 A * 12/2000 Ebert ................... H01S 5/0206
                                                        438/483

(Continued)

FOREIGN PATENT DOCUMENTS

CN        101911253 A      12/2010
CN        108886006 A      11/2018
(Continued)

OTHER PUBLICATIONS

PCT International Search Report and Written Opinion for International Application No. PCT/US2022/017055 mailed Jun. 10, 2022, 13 pages.
(Continued)

*Primary Examiner* — Ronald D Hartman, Jr.
(74) *Attorney, Agent, or Firm* — Lowenstein Sandler LLP

(57) ABSTRACT

A target concentration profile for a film to be deposited on a surface of a substrate during a deposition process for the substrate at a process chamber of a manufacturing system is identified. Data of the target concentration profile is processed using a model. The model outputs a set of deposition process settings that corresponds to the target concentration profile. One or more operations of the deposition process are performed in accordance with the set of deposition process settings.

20 Claims, 7 Drawing Sheets

(58) Field of Classification Search
USPC ........................................................ 700/121
See application file for complete search history.

(56) References Cited

U.S. PATENT DOCUMENTS

| | | | | |
|---|---|---|---|---|
| 7,328,418 | B2 * | 2/2008 | Yamashita | H01L 22/20 |
| | | | | 700/121 |
| 10,817,801 | B2 | 10/2020 | Piche et al. | |
| 2003/0049376 | A1 | 3/2003 | Schwarm et al. | |
| 2009/0000950 | A1 * | 1/2009 | Ortleb | H01L 22/12 |
| | | | | 204/298.03 |
| 2013/0164922 | A1 | 6/2013 | Cho et al. | |
| 2018/0082826 | A1 | 3/2018 | Geldbach et al. | |
| 2018/0358217 | A1 | 12/2018 | Blessing et al. | |
| 2018/0358271 | A1 | 12/2018 | David | |
| 2019/0218666 | A1 * | 7/2019 | Harada | H01L 21/31 |
| 2020/0110852 | A1 | 4/2020 | Banna et al. | |
| 2020/0333774 | A1 | 10/2020 | Banna | |
| 2022/0205105 | A1 * | 6/2022 | Chandrasekharan | |
| | | | | H01L 21/67103 |
| 2022/0207223 | A1 * | 6/2022 | Das | G06F 30/33 |

FOREIGN PATENT DOCUMENTS

| | | | |
|---|---|---|---|
| EP | 3654103 | A1 | 5/2020 |
| JP | 2003209058 | A | 7/2003 |
| JP | 2007173334 | A | 7/2007 |
| JP | 2008529277 | A | 7/2008 |
| JP | 2013207109 | A | 10/2013 |
| JP | 2020015954 | A | 1/2020 |
| JP | 2020038888 | A | 3/2020 |
| JP | 2020123675 | A | 8/2020 |
| WO | 2008015912 | A1 | 2/2008 |
| WO | 2020076719 | A1 | 4/2020 |
| WO | 2020172186 | A1 | 8/2020 |
| WO | 2021001109 | A1 | 1/2021 |

OTHER PUBLICATIONS

Extended European Search Report for European Application No. 22763764.2 mailed Sep. 23, 2025, 11 Pages.

* cited by examiner

200

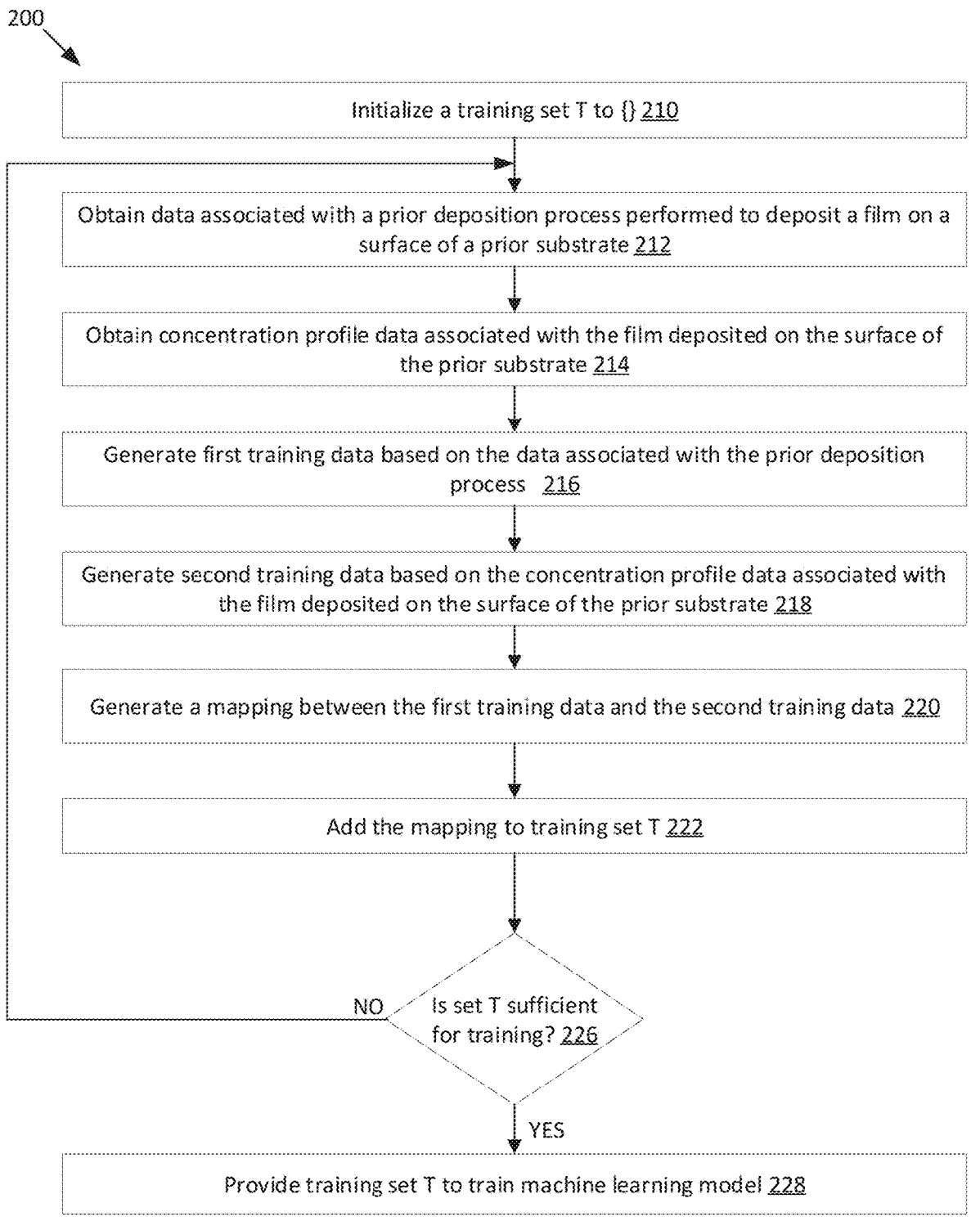

Initialize a training set T to {} 210

Obtain data associated with a prior deposition process performed to deposit a film on a surface of a prior substrate 212

Obtain concentration profile data associated with the film deposited on the surface of the prior substrate 214

Generate first training data based on the data associated with the prior deposition process 216

Generate second training data based on the concentration profile data associated with the film deposited on the surface of the prior substrate 218

Generate a mapping between the first training data and the second training data 220

Add the mapping to training set T 222

NO ——— Is set T sufficient for training? 226

YES

Provide training set T to train machine learning model 228

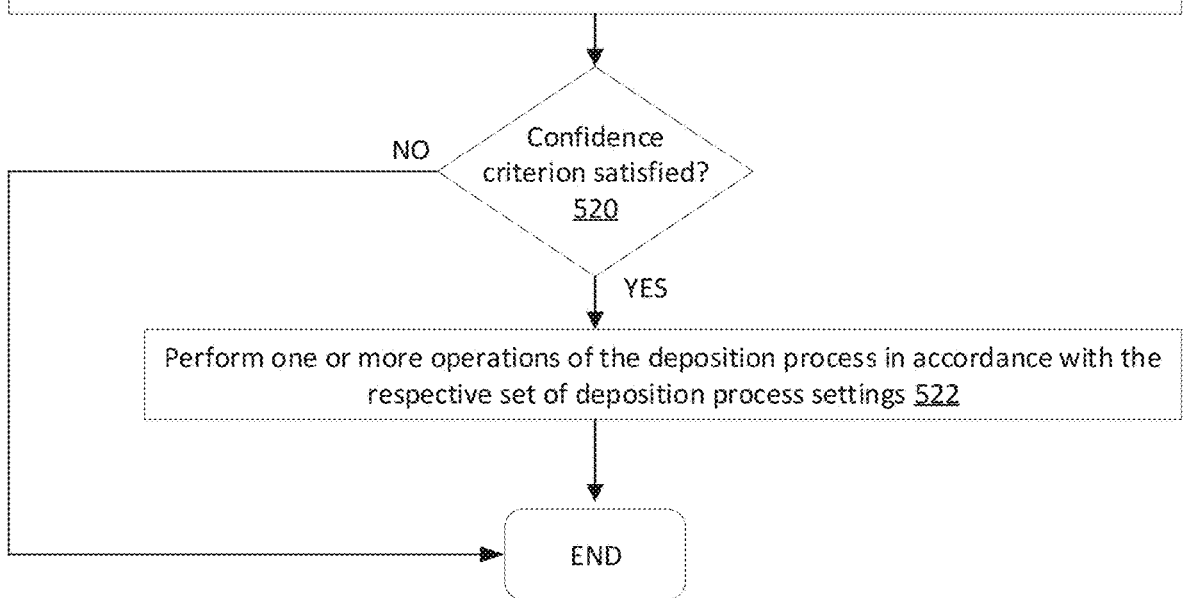

START

Receive, for a film to be deposited on a surface of a substrate, an indication of a target thickness of the film, a target initial concentration for a material of the film, and a target final concentration for the material in the film   510

Determine a target concentration profile for the film based on the target thickness, the target initial concentration, and the target final concentration   512

Provide the target concentration profile as input to a trained machine learning model 514

Obtain output(s) from the machine learning model   516

Determine, from the one or more outputs of the machine learning model:
- process recipe data identifying one or more sets of deposition process settings
- for each set of deposition process settings, an indication of a level of confidence that a respective set of deposition process settings corresponds to the target concentration profile for the film to be deposited on the substrate   518

NO ← Confidence criterion satisfied? 520

YES

Perform one or more operations of the deposition process in accordance with the respective set of deposition process settings 522

END

FIG. 5

CONTROLLING CONCENTRATION PROFILES FOR DEPOSITED FILMS USING MACHINE LEARNING

RELATED APPLICATION

This application is a continuation application of co-pending U.S. patent application Ser. No. 17/191,026, filed Mar. 2, 2021, the contents of which are entirely incorporated by reference.

TECHNICAL FIELD

Embodiments of the present disclosure relate, in general, to manufacturing systems and more particularly to controlling concentration profiles for deposited films using machine learning.

BACKGROUND

Processing electronic devices at a manufacturing system can include producing intricately patterned material layers on a surface of a substrate. The manufacturing system can deposit a film on the surface of the substrate and can perform an etch process to form the intricate pattern in the deposited film. The type of materials and the concentration of each material in the deposited film can affect the performance of the etch process (e.g., the speed of the etch process, the accuracy of the etch process, etc.). As electronic devices become more detailed and complex, an operator of the manufacturing system can seek to adjust or enhance the material characteristics of a deposited film in order to produce an etched substrate that satisfies particular device specifications. However, it can be difficult for the operator to identify the appropriate manufacturing steps or settings that will result in an electronic device that satisfies device specifications.

SUMMARY

Some of the embodiments described cover a method, where the method includes providing, as input to a trained machine learning model, data associated with a target concentration profile for a film to be deposited on a surface of a substrate during a deposition process for the substrate at a process chamber of a manufacturing system. The method further includes obtaining one or more outputs of the trained machine learning model. The method further includes determining, from the one or more outputs, process recipe data identifying one or more sets of deposition process settings and, for each set of deposition process settings, an indication of a level of confidence that a respective set of deposition process settings corresponds to the target concentration profile for the film to be deposited on the substrate. The method further includes identifying the respective set of deposition process settings with a level of confidence that satisfies a level of confidence criterion. The method further includes performing one or more operations of the deposition process in accordance with the respective set of deposition process settings.

In some embodiments, a system includes a memory and a processing device coupled to the memory. The processing device is to predict one or more deposition settings for a deposition process to be performed for a current substrate at a manufacturing system. The deposition process includes depositing a film on a surface of the current substrate. The processing device is further to generate first training data for the machine learning model. The first training data includes historical data associated with one or more prior deposition settings for a prior deposition process previously performed for a prior substrate at the manufacturing system, where the prior deposition process comprises depositing a prior film on a surface of a prior substrate. The processing device is further to generate second training data for the machine learning model. The second training data is associated with a historical concentration profile for the prior film deposited on the surface of the prior substrate. The processing device is further to provide the first training data and the second training data to train the machine learning model to predict, for the deposition process to be performed for the current substrate, which set of deposition settings for the deposition process corresponds to a target concentration profile for the film to be deposited on the surface of the current substrate.

In some embodiments, a non-transitory computer readable storage medium includes instructions that, when executed by a processing device, cause the processing device to provide, as input to a trained machine learning model, data associated with a target concentration profile for a film to be deposited on a surface of a substrate during a deposition process for the substrate at a process chamber of a manufacturing system. The processing device is further to obtain one or more outputs of the trained machine learning model. The processing device is further to determine, from the one or more outputs, process recipe data identifying one or more sets of deposition process settings and, for each set of deposition process settings, an indication of a level of confidence that a respective set of deposition process settings corresponds to the target concentration profile for the film to be deposited on the substrate. The processing device is further to identify the respective set of deposition process settings with a level of confidence that satisfies a level of confidence criterion. The processing device is further to perform one or more operations of the deposition process in accordance with the respective set of deposition process settings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2 is a flow chart of a method for training a machine learning model, according to aspects of the present disclosure.

FIG. 3 is a top schematic view of an example manufacturing system, according to aspects of the present disclosure.

FIG. 5 is a flow chart of a method for controlling a concentration profile for a deposited film using machine learning, according to aspects of the present disclosure.

DETAILED DESCRIPTION OF EMBODIMENTS

Figure 1:
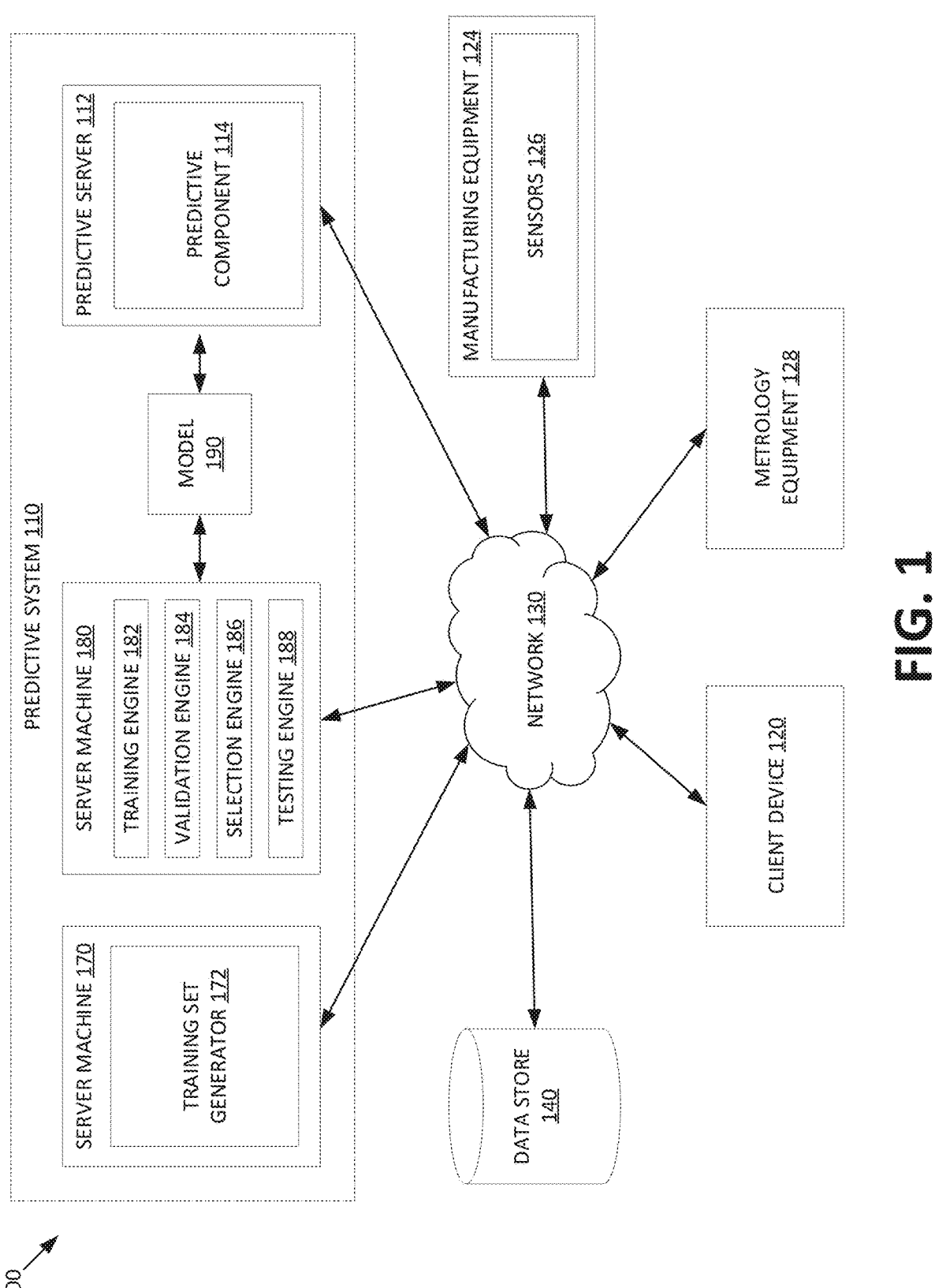
FIG. 1 depicts an illustrative computer system architecture, according to aspects of the present disclosure.

Implementations described herein provide systems and methods for controlling concentration profiles for deposited films using machine learning. A film can be deposited on a surface of a substrate during a deposition process performed at a process chamber of a manufacturing system. The film can include one or more layers of materials that are formed during the deposition process. For example, a first layer of material can be formed directly on the surface of the substrate (referred to as a proximal layer or proximal end of the film). After the first layer is formed on the surface of the substrate, a second layer of material can be formed on the first layer. This process continues until the deposition process is completed and a final layer is formed for the film (referred to as the distal layer or distal end of the film).

In some embodiments, each layer of material of a deposited film can include multiple different materials. For example, a film deposited on a surface of a substrate can include one or more boron- and-silicon-containing layers. The boron-and-silicon-containing layers can be used as a mask for an etch process. A mask defines a particular structure (e.g., a vertical opening, an electrical contact opening, etc.) that is formed on the substrate surface during the etch process. Particular materials of the boron-and-silicon-containing layers remain on the substrate surface during the etch process (referred to as etch resistant materials), while other materials are etched away by plasma (referred to as etchant materials).

In some embodiments, structural properties of openings etched onto the surface of the substrate can be affected by a concentration of particular materials at each layer of a deposited film. For example, in a film including boron-and-silicon-containing layers, an etch process can be performed to create opening sidewalls and opening floors on the substrate. A boron-and-silicon-containing layer having a low concentration of boron can increase the etch selectivity of the layer over an etch stop layer (i.e., a layer of material that terminates the etch process for at least a portion of the substrate), allowing for a more precise opening floor to be formed. However, the low boron concentration can cause the opening sidewalls to be rougher and less precise than a boron-and-silicon-containing layer having a high boron concentration. Conversely, a boron-and-silicon-containing layer having a high boron concentration can allow for the formation of precise opening sidewalls, while causing the opening floors to be less precise than a boron-and-silicon-containing layer having a low boron concentration. As the complexity of electronic devices increases, specificity and sensitivity for structures etched onto the substrate surface also increases. As indicated above, the specificity and sensitivity of structures etched onto the substrate surface can depend on a concentration of particular materials in various layers of a deposited film.

In some instances, a user of a manufacturing system (e.g., an operator) may want to perform a deposition process to deposit a film having a target concentration profile on a surface of a substrate. A concentration profile refers to a particular concentration gradient (i.e., a change in the concentration of a particular material between various layers of a deposited film) of a deposited film relative to a final thickness of the deposited film. For example, a concentration profile for a boron-and-silicon-containing containing film can include a proximal layer having a low concentration of boron and a distal layer having a high concentration of boron, while the concentration of boron in film layers between the proximal and distal layers increases linearly. In some embodiments, a target concentration profile for a film can be a film concentration profile that facilitates the etching of structures onto the surface of a substrate having a target degree of precision (e.g., a 95% degree of precision, a 98% degree of precision, a 99.9999999% degree of precision, etc.).

In some instances, it can be difficult to determine settings for a deposition process that will result in a deposited film having a target concentration profile. For example, deposition process settings that cause the flow of a precursor for a particular material to increase or decrease at a constant rate (i.e. linearly) may not result in a deposited film having a concentration profile that includes a respective linear increase or decrease of the particular material between proximal and distal layers of the deposited film. For example, diborane ($B_2H_6$) can be used as a precursor for a silicon-based and boron-based deposition process. An increase in the flow of diborane can increase the amount of boron (B) in the process chamber, which can increase the deposition rate for the process. In some instances, the increased deposition rate can cause a non-linear profile of the silicon and boron in the deposited film. In some instances, a significant number of experiments can be performed (e.g., by a user of a manufacturing system) to attempt to determine deposition process settings that will result in a deposited film having a target concentration profile. However, these experiments can consume a significant amount of manufacturing system resources appropriate deposition process settings for the target concentration profile may not be identified.

Aspects of the present disclosure address the above noted and other deficiencies by providing systems and methods for controlling concentration profiles for deposited films using machine learning. A processing device of a manufacturing system can provide, as input to a trained machine learning model, data associated with a target concentration profile for a film to be deposited on a surface of a substrate during a deposition process. The machine learning model can be trained to predict, for the deposition process, which set of deposition settings corresponds to the target concentration profile for the film to be deposited on the surface of the substrate. In some embodiments, the processing device can receive the data associated with the target concentration profile from a client device connected to the manufacturing system. For example, a user of the manufacturing system can provide, via the client device, an indication of a target thickness for the film, an indication of a target initial concentration for a proximal layer of the film, an indication of a target final concentration for a distal layer of the film, and an indication of a target shape for the concentration gradient between the proximal and distal layers of the film (i.e., a linear shape, a non-linear shape, etc.). In response to providing the data associated with the target concentration profile for the film as input to the machine learning model, the processing device can obtain one or more outputs of the machine learning model. The processing device can determine, based on the one or more outputs, process recipe data identifying one or more sets of deposition process settings and, for each set of deposition process settings, an indication of a level of confidence that a respective set of deposition process settings corresponds to the target concentration profile. The processing device can identify the respective set of deposition settings that has a level of confidence that satisfies a level of confidence criterion (e.g., exceeds a level of confidence threshold value) and perform the deposition process for the substrate according to the respective set of deposition settings.

As mentioned above, the machine learning model can be trained to predict, for the deposition process, which set of deposition settings correspond to a target concentration profile for a film to be deposited on a surface of a substrate during a deposition process. In some embodiments, the machine learning model can be trained based on historical data associated with a prior deposition process performed for one or more prior substrates at the manufacturing system. For example, first training data for the machine learning model can include historical data associated with prior deposition settings for the prior deposition process previously performed to deposit a prior film on a surface of a prior substrate at the manufacturing system. Second training data for the machine learning model can be associated with a historical concentration profile for the prior film deposited on the surface of the substrate. In some embodiments, the historical concentration profile can correspond to a historical metrology measurement value for the prior film (e.g., a thickness of the prior film) and a historical concentration associated with the prior film. Processing logic (e.g., a processing device of the manufacturing system) can provide the first and second training data to train the machine learning model.

Aspects of the present disclosure address deficiencies of the conventional technology by providing systems and methods for predicting deposition settings that correspond to a target profile for a film to be deposited on a surface of a substrate. Using data associated with historical deposition processes performed for prior substrates at the manufacturing system, the machine learning model can be trained to predict deposition settings that correspond to a target concentration profile for a current substrate to be processed at the manufacturing system. A processing device of the manufacturing system can provide data associated with the target concentration profile as input to the trained machine learning model and determine, based on outputs of the trained machine learning model, a set of deposition settings that corresponds to the target concentration profile. By using a machine learning model trained to identify deposition settings that correspond to a target concentration profile, a significant number of experiments is not performed to determine deposition process settings that will result in a deposited film having the target concentration profile. The reduction in the number of experiments reduces the consumption of manufacturing system resources, resulting in an increase of an overall throughput and efficiency and a decrease of an overall latency for the manufacturing system.

FIG. 1 depicts an illustrative computer system architecture 100, according to aspects of the present disclosure. In some embodiments, computer system architecture 100 can be included as part of a manufacturing system for processing substrates, such as manufacturing system 300 of FIG. 3. Computer system architecture 100 includes a client device 120, manufacturing equipment 124, metrology equipment 128, a predictive server 112 (e.g., to generate predictive data, to provide model adaptation, to use a knowledge base, etc.), and a data store 140. The predictive server 112 can be part of a predictive system 110. The predictive system 110 can further include server machines 170 and 180. The manufacturing equipment 124 can include sensors 125 configured to capture data for a substrate being processed at the manufacturing system. In some embodiments, the manufacturing equipment 124 and sensors 126 can be part of a sensor system that includes a sensor server (e.g., field service server (FSS) at a manufacturing facility) and sensor identifier reader (e.g., front opening unified pod (FOUP) radio frequency identification (RFID) reader for sensor system). In some embodiments, metrology equipment 128 can be part of a metrology system that includes a metrology server (e.g., a metrology database, metrology folders, etc.) and metrology identifier reader (e.g., FOUP RFID reader for metrology system).

Manufacturing equipment 124 can produce products, such as electronic devices, following a recipe or performing runs over a period of time. Manufacturing equipment 124 can include a process chamber, such as process chamber 400 described with respect to FIG. 4. Manufacturing equipment 124 can perform a process for a substrate (e.g., a wafer, etc.) at the process chamber. Examples of substrate processes include a deposition process to deposit a film on a surface of the substrate, an etch process to form a pattern on the surface of the substrate, etc. Manufacturing equipment 124 can perform each process according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc.

In some embodiments, manufacturing equipment 124 can include sensors 126 that are configured to generate data associated with a substrate processed at manufacturing equipment 124. For example, a process chamber can include one or more sensors configured to generate spectral or non-spectral data associated with the substrate before, during, and/or after a process (e.g., a deposition process) is performed for the substrate. In some embodiments, spectral data generated by sensors 126 can indicate a concentration of one or more materials deposited on a surface of a substrate. Sensors 126 configured to generate spectral data associated with a substrate can include reflectometry sensors, ellipsometry sensors, thermal spectra sensors, capacitive sensors, and so forth. Sensors 126 configured to generate non-spectral data associated with a substrate can include temperature sensors, pressure sensors, flow rate sensors, voltage sensors, etc. Further details regarding manufacturing equipment 124 are provided with respect to FIG. 3 and FIG. 4.

In some embodiments, sensors 126 can provide sensor data associated with manufacturing equipment 124. Sensor data can include a value of one or more of temperature (e.g., heater temperature), spacing (SP), pressure, high frequency radio frequency (HFRF), voltage of electrostatic chuck (ESC), electrical current, material flow, power, voltage, etc. Sensor data can be associated with or indicative of manufacturing parameters such as hardware parameters, such as settings or components (e.g., size, type, etc.) of the manufacturing equipment 124, or process parameters of the manufacturing equipment 124. The sensor data can be provided while the manufacturing equipment 124 is performing manufacturing processes (e.g., equipment readings when processing products). The sensor data can be different for each substrate.

Metrology equipment 128 can provide metrology data associated with substrates processed by manufacturing equipment 124. The metrology data can include a value of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate.

In some embodiments, metrology equipment 128 can be included as part of the manufacturing equipment 124. For example, metrology equipment 128 can be included inside of or coupled to a process chamber and configured to generate metrology data for a substrate before, during, and/or after a process (e.g., a deposition process, an etch process, etc.) while the substrate remains in the process chamber. In such instances, metrology equipment 128 can be referred to as in-situ metrology equipment. In another example, metrology equipment 128 can be coupled to another station of manufacturing equipment 124. For example, metrology equipment can be coupled to a transfer chamber, such as transfer chamber 310 of FIG. 3, a load lock, such as load lock 320, or a factory interface, such as factory interface 306. In such instances, metrology equipment 128 can be referred to as integrated metrology equipment. In other or similar embodiments, metrology equipment 128 is not coupled to a station of manufacturing equipment 124. In such instances, metrology equipment 128 can be referred to as inline metrology equipment or external metrology equipment. In some embodiments, integrated metrology equipment and/or inline metrology equipment are configured to generate metrology data for a substrate before and/or after a process.

The client device 120 my include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the metrology data can be received from the client device 120. Client device 120 can display a graphical user interface (GUI), where the GUI enables the user to provide, as input, metrology measurement values for substrates processed at the manufacturing system.

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that can span multiple computing devices (e.g., multiple server computers). The data store 140 can store data associated with processing a substrate at manufacturing equipment 124. For example, data store 140 can store data collected by sensors 126 at manufacturing equipment 124 before, during, or after a substrate process (referred to as process data). Process data can refer to historical process data (e.g., process data generated for a prior substrate processed at the manufacturing system) and/or current process data (e.g., process data generated for a current substrate processed at the manufacturing system). Data store can also store spectral data or non-spectral data associated with a portion of a substrate processed at manufacturing equipment 124. Spectral data can include historical spectral data and/or current spectral data.

In some embodiments, data store 140 can also store concentration profile data associated with a film deposited on a surface of a substrate. As described previously, a concentration profile refers to a particular concentration gradient (i.e., a change in the concentration of a particular material between various layers of a deposited film) of a deposited film relative to a final thickness of the deposited film. In some embodiments, concentration profile data can include a thickness or a film deposited on a surface of a substrate, an initial concentration of a particular material in the film (e.g., a concentration of the particular material in a proximal layer of the film), and a final concentration of the particular material in the film (e.g., a concentration of the particular material in a distal layer of the film). In some embodiments, concentration profile data can also include an indication of a rate of change of the concentration of the particular material within the film layers between the proximal and distal layer. For example, concentration profile data can include an indication of linear rate of change (i.e., a constant rate of change) or a non-linear rate of change (i.e., a non-constant rate of change) of the concentration of the particular material in the layers between the proximal and distal layers of the deposited film. In some embodiments, concentration profile data can be provided by a user (e.g., an operator) of the manufacturing system (e.g., via client device 120). In other or similar embodiments, concentration profile data can be determined by a processing device of the manufacturing system, (e.g., system controller 328 of FIG. 3) based on sensor data and/or metrology data stored at the data store 140. Concentration profile data can refer to historical concentration profile data (e.g., concentration profile data for a prior film deposited on a prior substrate) or current concentration profile data (e.g., concentration profile data for a current film deposited on a current substrate).

In some embodiments, concentration profile data can also include data associated with a target concentration profile for a film to be deposited on a surface of a substrate. For example, a user of the operating system (e.g., an operator) can provide data associated with a target concentration profile via client device 120. The data associated with the target concentration profile can include at least of a target thickness of the film to be deposited on the surface of the substrate, a target initial concentration of a particular material of the film (e.g., a concentration of the particular material at a proximal layer of the film, and a target final concentration of the particular material of the film (e.g., a concentration of the particular material at the distal layer of the film). In some embodiments, the data associated with the target concentration can also include an indication of a target rate of change (e.g., linear, non-linear, etc.) of the concentration gradient for the particular material within the layers between the proximal and distal layers of the film.

The data store 140 can also store contextual data associated with one or more substrates processed at the manufacturing system. Contextual data can include a recipe name, recipe step number, preventive maintenance indicator, operator, etc. Contextual data can refer to historical contextual data (e.g., contextual data associated with a prior process performed for a prior substrate) and/or current process data (e.g., contextual data associated with current process or a future process to be performed for a prior substrate). In some embodiments, contextual data can also include an indication of one or more settings associated with a particular process. For example, contextual data for a deposition process can include a temperature setting for a process chamber, a pressure setting for a process chamber, a flow rate setting for a precursor for a material of a film deposited on a substrate, etc.

In some embodiments, data store 140 can be configured to store data that is not accessible to a user of the manufacturing system. For example, process data, spectral data, contextual data, etc. obtained for a substrate being processed at the manufacturing system is not accessible to a user (e.g., an operator) of the manufacturing system. In some embodiments, all data stored at data store 140 can be inaccessible by the user of the manufacturing system. In other or similar embodiments, a portion of data stored at data store 140 can be inaccessible by the user while another portion of data stored at data store 140 can be accessible by the user. In some embodiments, one or more portions of data stored at data store 140 can be encrypted using an encryption mechanism that is unknown to the user (e.g., data is encrypted using a private encryption key). In other or similar embodiments, data store 140 can include multiple data stores where data that is inaccessible to the user is stored in one or more first data stores and data that is accessible to the user is stored in one or more second data stores.

In some embodiments, predictive system 110 includes server machine 170 and server machine 180. Server machine 170 includes a training set generator 172 that is capable of generating training data sets (e.g., a set of data inputs and a set of target outputs) to train, validate, and/or test a machine learning model 190. Some operations of data set generator 172 are described in detail below with respect to FIG. 2. In some embodiments, the data set generator 172 can partition the training data into a training set, a validating set, and a testing set. In some embodiments, the predictive system 110 generates multiple sets of training data.

Server machine 180 can include a training engine 182, a validation engine 184, a selection engine 185, and/or a testing engine 186. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training a machine learning model 190. The machine learning model 190 can refer to the model artifact that is created by the training engine 182 using the training data that includes training inputs and corresponding target outputs (correct answers for respective training inputs). The training engine 182 can find patterns in the training data that map the training input to the target output (the answer to be predicted), and provide the machine learning model 190 that captures these patterns. The machine learning model 190 can use one or more of support vector machine (SVM), Radial Basis Function (RBF), clustering, supervised machine learning, semi-supervised machine learning, unsupervised machine learning, k-nearest neighbor algorithm (k-NN), linear regression, ridge regression, random forest, neural network (e.g., artificial neural network), etc.

The validation engine 184 can be capable of validating a trained machine learning model 190 using a corresponding set of features of a validation set from training set generator 172. The validation engine 184 can determine an accuracy of each of the trained machine learning models 190 based on the corresponding sets of features of the validation set. The validation engine 184 can discard a trained machine learning model 190 that has an accuracy that does not meet a threshold accuracy. In some embodiments, the selection engine 185 can be capable of selecting a trained machine learning model 190 that has an accuracy that meets a threshold accuracy. In some embodiments, the selection engine 185 can be capable of selecting the trained machine learning model 190 that has the highest accuracy of the trained machine learning models 190.

The testing engine 186 can be capable of testing a trained machine learning model 190 using a corresponding set of features of a testing set from data set generator 172. For example, a first trained machine learning model 190 that was trained using a first set of features of the training set can be tested using the first set of features of the testing set. The testing engine 186 can determine a trained machine learning model 190 that has the highest accuracy of all of the trained machine learning models based on the testing sets.

Predictive server 112 includes a predictive component 114 that is capable of providing data associated with a target concentration profile for a film to be deposited on a surface of a substrate during a deposition process for the substrate and running trained machine learning model 190 on the input to obtain one or more outputs. As described in detail below with respect to FIG. 7, in some embodiments, predictive component 114 is also capable of determining process recipe data from the output of the trained machine learning model 190 and using the process recipe data to predict deposition settings that correspond to a target concentration profile for the film to be deposited on the surface of the substrate. The process recipe data can include or indicate one or more sets of deposition process settings and, for each set of deposition process settings, a level of confidence that a respective set of deposition settings corresponds to the target concentration profile. Each set of deposition process settings can be associated with a particular concentration profile for the film to be deposited on the surface of the substrate. Predictive system 110 can determine that a respective set of deposition process settings corresponds to the target concentration profile in response to determining that a difference between the particular profile associated with the respective set of deposition process settings and the target concentration profile is below a threshold difference value.

The client device 120, manufacturing equipment 124, sensors 126, metrology equipment 128, predictive server 112, data store 140, server machine 170, and server machine 180 can be coupled to each other via a network 130. In some embodiments, network 130 is a public network that provides client device 120 with access to predictive server 112, data store 140, and other publically available computing devices. In some embodiments, network 130 is a private network that provides client device 120 access to manufacturing equipment 124, metrology equipment 128, data store 140, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machines 170 and 180, as well as predictive server 112, can be provided by a fewer number of machines. For example, in some embodiments, server machines 170 and 180 can be integrated into a single machine, while in some other or similar embodiments, server machines 170 and 180, as well as predictive server 112, can be integrated into a single machine.

In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

FIG. 2 is a flow chart of a method 200 for training a machine learning model, according to aspects of the present disclosure. Method 200 is performed by processing logic that can include hardware (circuitry, dedicated logic, etc.), software (such as is run on a general purpose computer system or a dedicated machine), firmware, or some combination thereof. In one implementation, method 200 can be performed by a computer system, such as computer system architecture 100 of FIG. 1. In other or similar implementations, one or more operations of method 200 can be performed by one or more other machines not depicted in the figures. In some aspects, one or more operations of method 200 can be performed by training set generator 172 of server machine 170.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 210, processing logic initializes a training set T to an empty set (e.g., { }). At block 212, processing logic obtains data associated with a prior deposition process performed to deposit a film on a surface of a prior substrate. In some embodiments, the data associated with the deposition process is historical data associated with one or more prior deposition settings for a prior deposition process previously performed for a prior substrate at a manufacturing system. For example, the historical data can be historical contextual data associated with the prior deposition process stored at data store 140. In some embodiments, the one or more prior deposition settings can include at least one of a prior temperature setting for the prior deposition process, a prior pressure setting for the prior deposition setting or a prior flow rate setting for a precursor for one or more material of the prior film deposited on the surface of the prior substrate. A flow rate setting can refer to a flow rate setting for the precursor at an initial instance of the prior deposition process (referred to as an initial flow rate setting), a flow rate setting for the precursor at a final instance of the prior deposition process (referred to as a final flow rate setting), or a ramping rate for the flow rate of the precursor during the deposition process. In one example, the precursor for the prior film can include a boron-containing precursor or a silicon-containing precursor.

At block 214, processing logic obtains concentration profile data associated with the film deposited on the surface of the prior substrate. As discussed previously, a concentration profile refers to a particular concentration gradient of a deposited film relative to a final thickness of the deposited film. Concentration profile data can include historical concentration profile data for a prior film deposited on a surface of a prior substrate. In some embodiments the historical concentration profile for the prior film can correspond to a historical metrology measurement value associated with the prior film (e.g., a thickness of the prior film) and a historical concentration associated with the prior film. In some embodiments, the historical concentration profile for the prior film can additionally or alternatively correspond to a historical concentration gradient associated with the prior film. Processing logic can obtain the concentration profile data associated with the deposited film from data store 140, in accordance with previously described embodiments.

At block 216, processing logic generates first training data based on the obtained data associated with the prior deposition process performed for the prior substrate (e.g., the data obtained at block 212). At block 218, processing logic generates second training data based on the concentration profile data associated with the film deposited on the surface of the prior substrate (e.g., the data obtained at block 214). At block 220, processing logic generates a mapping between the first training data and the second training data. The mapping refers to the first training data that includes or is based on data for the prior deposition process performed for the prior substrate and the second training data that includes or is based on concentration profile data associated with the film deposited on the surface of the prior substrate, where the first training data is associated with (or mapped to) the second training data. At block 224, processing logic adds the mapping to the training set T.

At block 226, processing logic determines whether the training set, T, includes a sufficient amount of training data to train a machine learning model. It should be noted that in some implementations, the sufficiency of training set T can be determined based simply on the number of mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set does not include a sufficient amount of training data to train the machine learning model, method 200 returns to block 212. Responsive to determining the training set, T, includes a sufficient amount of training data to train the machine learning model, method 200 continues to block 228.

At block 228, processing logic provides the training set T to train the machine learning model. In one implementation, the training set T is provided to training engine 182 of server machine 180 to perform the training. In the case of a neural network, for example, input values of a given input/output mapping are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T. After block 228, machine learning model 190 can be used to predict, for a deposition process to be performed for a current substrate, which set of deposition settings for the deposition process corresponds to a target concentration profile for a film to be deposited on a surface of the current substrate.

Figure 3:
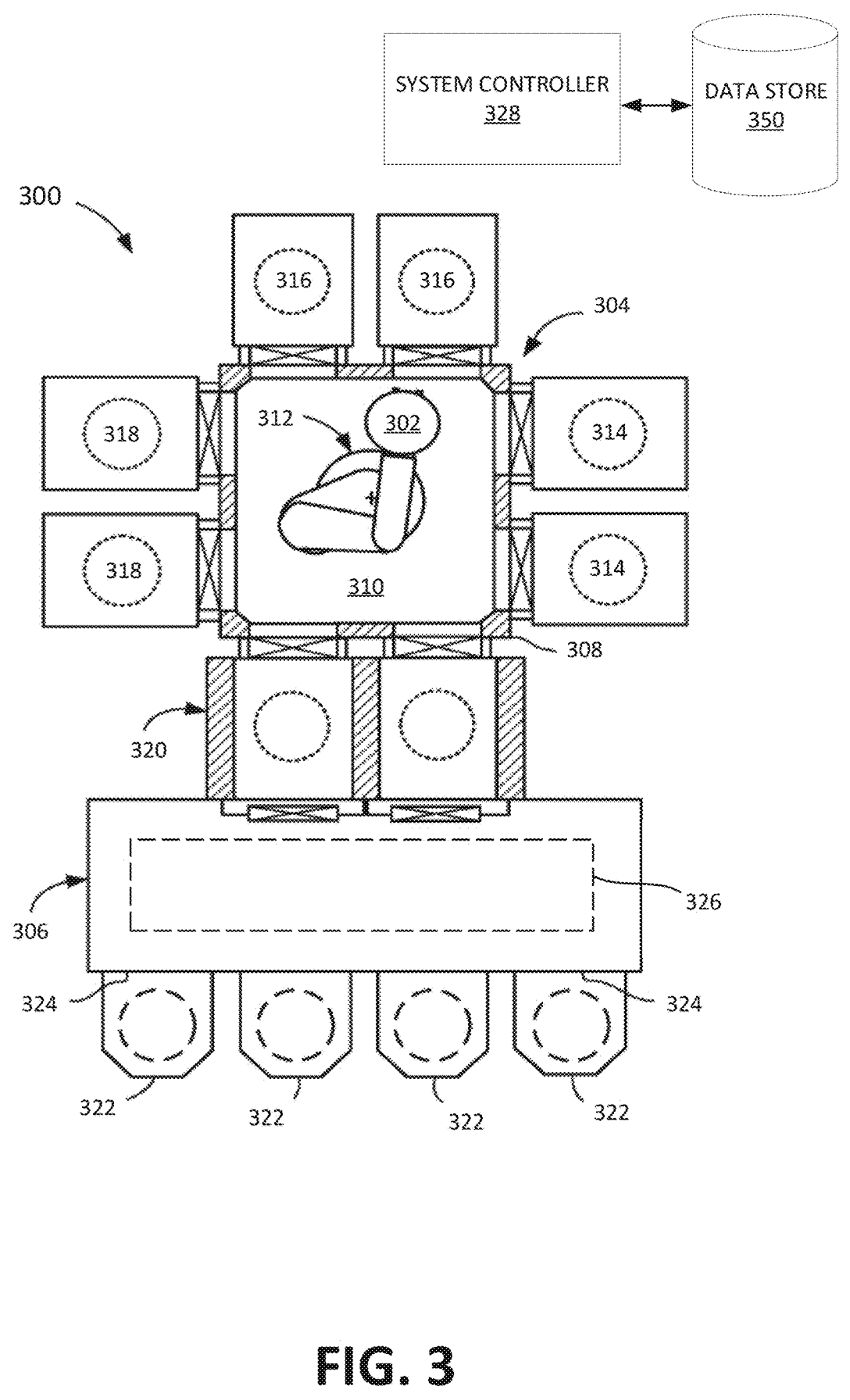

In some embodiments, a manufacturing system can include more than one process chamber. For example, example manufacturing system 300 of FIG. 3 illustrates multiple process chambers 314, 316, 318. It should be noted that, in some embodiments, data obtained to train the machine learning model and data collected to be provided as input to the trained machine learning model can be associated with the same process chamber of the manufacturing system. In other or similar embodiments, data obtained to train the machine learning model and data collected to be provided as input to the trained machine learning model can be associated with different process chambers of the manufacturing system. In other or similar embodiments, data obtained to train the machine learning model can be associated with a process chamber of a first manufacturing system and data collected to be provide as input to the trained machine learning model can be associated with a process chamber of a second manufacturing system.

FIG. 3 is a top schematic view of an example manufacturing system 300, according to aspects of the present disclosure. Manufacturing system 300 can perform one or more processes on a substrate 302. Substrate 302 can be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 300 can include a process tool 304 and a factory interface 306 coupled to process tool 304. Process tool 304 can include a housing 308 having a transfer chamber 310 therein. Transfer chamber 310 can include one or more process chambers (also referred to as processing chambers) 314, 316, 318 disposed therearound and coupled thereto. Process chambers 314, 316, 318 can be coupled to transfer chamber 310 through respective ports, such as slit valves or the like. Transfer chamber 310 can also include a transfer chamber robot 312 configured to transfer substrate 302 between process chambers 314, 316, 318, load lock 320, etc. Transfer chamber robot 312 can include one or multiple arms where each arm includes one or more end effectors at the end of each arm. The end effector can be configured to handle particular objects, such as wafers.

Process chambers 314, 316, 318 can be adapted to carry out any number of processes on substrates 302. A same or different substrate process can take place in each processing chamber 314, 316, 318. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Process chambers 314, 316, 318 can each include one or more sensors configured to capture data for substrate 302 before, after, or during a substrate process. For example, the one or more sensors can be configured to capture spectral data and/or non-spectral data for a portion of substrate 302 during a substrate process. In other or similar embodiments, the one or more sensors can be configured to capture data associated with the environment within process chamber 314, 316, 318 before, after, or during the substrate process. For example, the one or more sensors can be configured to capture data associated with a temperature, a pressure, a gas concentration, etc. of the environment within process chamber 314, 316, 318 during the substrate process.

A load lock 320 can also be coupled to housing 308 and transfer chamber 310. Load lock 320 can be configured to interface with, and be coupled to, transfer chamber 310 on one side and factory interface 306. Load lock 320 can have an environmentally-controlled atmosphere that can be changed from a vacuum environment (wherein substrates can be transferred to and from transfer chamber 310) to an at or near atmospheric-pressure inert-gas environment (wherein substrates can be transferred to and from factory interface 306) in some embodiments. Factory interface 306 can be any suitable enclosure, such as, e.g., an Equipment Front End Module (EFEM). Factory interface 306 can be configured to receive substrates 302 from substrate carriers 322 (e.g., Front Opening Unified Pods (FOUPs)) docked at various load ports 324 of factory interface 306. A factory interface robot 326 (shown dotted) can be configured to transfer substrates 302 between carriers (also referred to as containers) 322 and load lock 320. Carriers 322 can be a substrate storage carrier or a replacement part storage carrier.

Manufacturing system 300 can also be connected to a client device (not shown) that is configured to provide information regarding manufacturing system 300 to a user (e.g., an operator). In some embodiments, the client device can provide information to a user of manufacturing system 300 via one or more graphical user interfaces (GUIs). For example, the client device can provide information regarding a target concentration profile for a film to be deposited on a surface of a substrate 302 during a deposition process performed at a process chamber 314, 316, 318 via a GUI. The client device can also provide information regarding a modification to a process recipe in view of a respective set of deposition settings predicted to correspond to the target profile, in accordance with embodiments described herein.

Manufacturing system 300 can also include a system controller 328. System controller 328 can be and/or include a computing device such as a personal computer, a server computer, a programmable logic controller (PLC), a microcontroller, and so on. System controller 328 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 328 can include a data storage device (e.g., one or more disk drives and/or solid state drives), a main memory, a static memory, a network interface, and/or other components. System controller 328 can execute instructions to perform any one or more of the methodologies and/or embodiments described herein. In some embodiments, system controller 328 can execute instructions to perform one or more operations at manufacturing system 300 in accordance with a process recipe. The instructions can be stored on a computer readable storage medium, which can include the main memory, static memory, secondary storage and/or processing device (during execution of the instructions).

System controller 328 can receive data from sensors included on or within various portions of manufacturing system 300 (e.g., processing chambers 314, 316, 318, transfer chamber 310, load lock 320, etc.). In some embodiments, data received by the system controller 328 can include spectral data and/or non-spectral data for a portion of substrate 302. In other or similar embodiments, data received by the system controller 328 can include data associated with processing substrate 302 at processing chamber 314, 316, 318, as described previously. For purposes of the present description, system controller 328 is described as receiving data from sensors included within process chambers 314, 316, 318. However, system controller 328 can receive data from any portion of manufacturing system 300 and can use data received from the portion in accordance with embodiments described herein. In an illustrative example, system controller 328 can receive data from one or more sensors for process chamber 314, 316, 318 before, after, or during a substrate process at the process chamber 314, 316, 318. Data received from sensors of the various portions of manufacturing system 300 can be stored in a data store 350. Data store 350 can be included as a component within system controller 328 or can be a separate component from system controller 328. In some embodiments, data store 350 can be data store 140 described with respect to FIG. 1.

Figure 4:
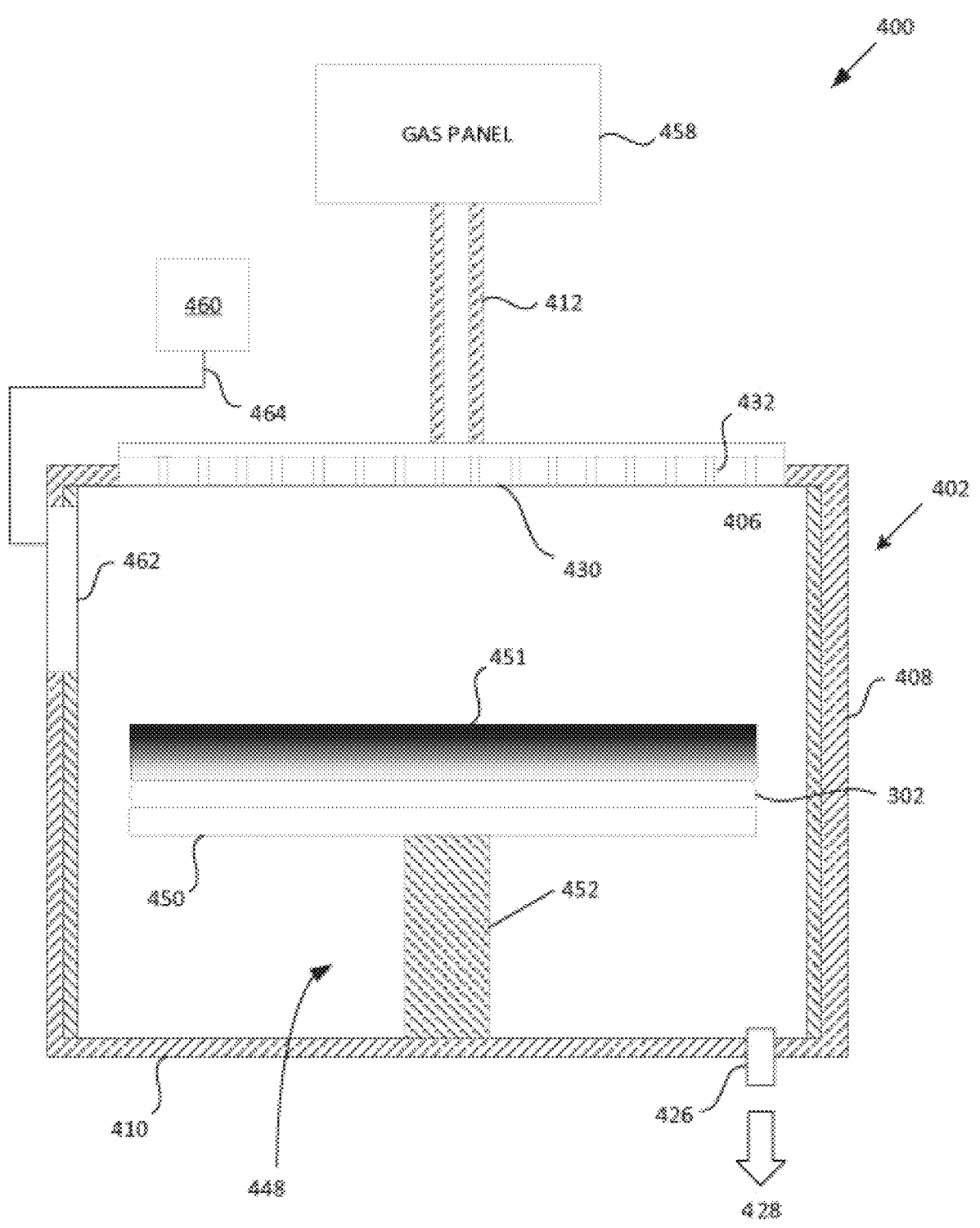
FIG. 4 is a cross-sectional schematic side view of an example process chamber of the example manufacturing system, according to aspects of the present disclosure.

FIG. 4 is a cross-sectional schematic side view of a process chamber 400, in accordance with embodiments of the present disclosure. In some embodiments, process chamber 400 can correspond to process chamber 314, 316, 318, described with respect to FIG. 3. Process chamber 400 can be used for processes in which a corrosive plasma environment is provided. For example, the process chamber 400 can be a chamber for a plasma etcher or plasma etch reactor, and so forth. In another example, process chamber can be a chamber for a deposition process, as previously described. In one embodiment, the process chamber 400 includes a chamber body 402 and a showerhead 430 that encloses an interior volume 406. The showerhead 430 can include a showerhead base and a showerhead gas distribution plate. Alternatively, the showerhead 430 can be replaced by a lid and a nozzle in some embodiments, or by multiple pie shaped showerhead compartments and plasma generation units in other embodiments. The chamber body 402 can be fabricated from aluminum, stainless steel or other suitable material such as titanium (Ti). The chamber body 402 generally includes sidewalls 408 and a bottom 410. An exhaust port 426 can be defined in the chamber body 402, and can couple the interior volume 406 to a pump system 428. The pump system 428 can include one or more pumps and throttle valves utilized to evacuate and regulate the pressure of the interior volume 406 of the process chamber 400.

The showerhead 430 can be supported on the sidewall 408 of the chamber body 402. The showerhead 420 (or lid) can be opened to allow access to the interior volume 406 of the process chamber 400, and can provide a seal for the process chamber 400 while closed. A gas panel 458 can be coupled to the process chamber 400 to provide process and/or cleaning gases to the interior volume 406 through the showerhead 430 or lid and nozzle (e.g., through apertures of the showerhead or lid and nozzle). For example. gas panel 458 can provide precursors for materials of a film 451 deposited on a surface of a substrate 302. In some embodiments, a precursor can include a silicon-based precursor or a boron-based precursor. The showerhead 430 can include a gas distribution plate (GDP) and can have multiple gas delivery holes 432 (also referred to as channels) throughout the GDP. A substrate support assembly 448 is disposed in the interior volume 406 of the process chamber 400 below the showerhead 430. The substrate support assembly 448 holds a substrate 302 during processing (e.g., during a deposition process).

In some embodiments, process chamber 400 can be equipped with a concentration detection component 460. Concentration detection component 460 can include one or more sensors (e.g., acoustic sensors, optical sensors, ellipsometry sensors, etc.) that are configured to detect a material in process chamber 314, 316, 318. For example, the one or more sensors of concentration detection component 460 can be configured to detect signatures (i.e., a wavelength of a set of photons emitted by a plasma), such as optical signatures, acoustic signatures, and so forth, of materials during a process (e.g., a deposition process) in process chamber 314, 316, 318. Concentration detection component 460 can measure an amplitude of various wavelengths of photons emitted by one or more materials of the film 451 deposited on the surface of substrate 302. In other or similar embodiments, concentration detection component 460 can be a device configured to detect a specific wavelength of photons emitted by a single material of the film 451 deposited on the surface of substrate 302. It should be noted that, while the concentration detection component 460 can detect and measure the wavelengths of photons emitted by one or more materials of the film 451 deposited on the surface of substrate 302, concentration detection component 460 can also detect and measure the wavelengths of photons emitted by each material in the process chamber 400 (e.g., coatings deposited on the walls of the process chamber 400, etc.).

In some embodiments, concentration detection component 460 can be displaced outside of process chamber 400. In such embodiments, concentration detection component 460 can be configured to detect signatures (e.g., optical signatures, acoustic signatures, etc.) associated with materials in the process chamber 400 from outside of process chamber 400. In some embodiments, concentration detection component 460 can be an optical detection component (e.g., an optical emission spectroscopy (OES) device) configured to detect optical signatures through a transparent portion 462 (e.g., a window) embedded within a portion of chamber body 402. For example, the optical detection component can be configured to detect optical signatures through a window 462 embedded within a sidewall 408, a liner 416, bottom 410, and/or showerhead 430. Photons within process chamber 400 can be transmitted to the optical detection component through a photon transmission cable 464, such as a fiber optic cable, through window 462. In other or similar embodiments, one or more components of concentration detection component 460 can be displaced inside of process chamber 400. In some implementations, a process performed within process chamber 400 can be performed in a vacuum environment. As such, one or more components of concentration detection component 460 that are configured to operate within a vacuum environment can be displaced inside of process chamber 400.

In some embodiments, concentration detection component 460 can be operatively coupled to a system controller, such as system controller 328 of FIG. 3. Concentration detection component 460 can transmit data relating to a detected signature to the system controller during a deposition process performed at process chamber 400 to deposit film 451 on a surface of substrate 302. In some embodiments, the system controller can generate concentration gradient data for film 451 based on the data relating to the detected signature received from concentration detection component 460 during the deposition process performed at process chamber 400. For example, during the deposition process, various layers of film 451 are formed on the surface of substrate 302. At one or more instances of time during the deposition process, concentration detection component 460 can transmit data relating to a detected signature for a particular material in the deposited film 451 (e.g., a boron-based material, a silicon-based material, etc.). Based on the received signature, the system controller can determine a concentration of the particular material in the film at the particular instance of the deposition process. The system controller can generate the concentration gradient for film

451 based on each determined concentration of the particular material at each instance of the deposition process.

In some embodiments, processing chamber 400 can include metrology equipment (not shown) configured to generate in-situ metrology measurements during a process performed at process chamber 400. The metrology equipment can be operatively coupled to the system controller (e.g., system controller 328, as previously described). In some embodiments, the metrology equipment can be configured to generate a metrology measurement value (e.g., a thickness) for film 451 during particular instances of the deposition process. The system controller can generate a concentration profile for film 451 based on the received metrology measurement values from the metrology equipment. For example, the system controller can generate the concentration profile by associating the determined concentration of the particular material in the film at a particular instance of the deposition process with a metrology measurement value generated during the same or a similar instance of the deposition process. In other or similar embodiments, processing chamber 400 does not include metrology equipment. In such embodiments, the system controller can receive one or more metrology measurement values for film 451 after completion of the deposition process at process chamber 400. System controller can determine a deposition rate based on the one or more metrology measurement values and can associate generate the concentration profile for film 451 based on the determined concentration gradient and the determined deposition rate of the deposition process.

FIG. 5 is a flow chart of a method 500 for controlling a concentration profile for a deposited film using machine learning, according to aspects of the present disclosure. Method 500 is performed by processing logic that can include hardware (circuitry, dedicated logic, etc.), software (such as is run on a general purpose computer system or a dedicated machine), firmware, or some combination thereof. In some embodiments, method 500 can be performed using predictive server 112 and trained machine learning model 190 of FIG. 1. In other or similar embodiments, one or more blocks of FIG. 5 can be performed by one or more other machines not depicted in FIG. 1.

At block 510, processing logic optionally receives, for a film to be deposited on a surface of a substrate, an indication of a target thickness of the film, a target initial concentration for a particular material of the film, and a target final concentration for the material in the film. In some embodiments, processing logic can also receive an indication of a target rate of change (e.g., a linear change, a non-linear change, etc.) for the concentration of the particular material within various layers between the proximal and distal layers of the film. In some embodiments, processing logic can receive the indication of the target thickness, the target initial concentration, the target final concentration, and/or the target rate of change from a client device coupled to the manufacturing system. At block 512, processing logic optionally determines a target concentration profile for the film based on the target thickness, the target initial concentration, and the target final concentration. In some embodiments, processing logic can also determine the target concentration profile based on the target rate of change of the concentration for the particular material. Further details about determining the target concentration profile for the film are provided with respect to FIGS. 6A-7C.

At block 514, processing logic provides the target concentration profile as input to a trained machine learning model. In some embodiments, processing logic also pro-vides one or more process constraints associated with the deposition process as input to the trained machine learning model. At block 516, processing logic obtains outputs of the machine learning model.

At block 518, processing logic determines, from the one or more outputs, process recipe data identifying one or more sets of deposition process settings and, for each set of deposition process settings, an indication of a level of confidence that a respective set of deposition process settings corresponds to the target concentration profile for the film to be deposited on the substrate. Each set of deposition process settings can include, at least, a temperature setting for the process chamber, a pressure setting for the process chamber, or a flow rate setting (e.g., an initial flow rate, a final flow rate, a ramping rate, etc.) for a precursor (e.g., a silicon-containing precursor, a boron-containing precursor, etc.) for one or more materials of the film to be deposited on the surface of the substrate. For example, during a process to deposit one or more boron-and-silicon-containing layers, the set of deposition process settings can include, at least, a temperature setting and/or a pressure setting for the process chamber, a flow rate setting for a boron-based precursor and/or a silicon-based precursor of the one or more boron-and-silicon-containing layers during each instance of the deposition process. In some embodiments, each set of deposition process settings is associated with a particular concentration profile for the film to be deposited on the surface of the substrate. Processing logic can determine that a respective set of deposition process settings corresponds to a target concentration by determining that a difference between the particular profile associated with the respective set of deposition process settings and the target concentration profile for the film to be deposited on the surface of the substrate is below a threshold difference value.

At block 520, processing logic determines whether a level of confidence criterion for each of the respective sets of deposition process settings is satisfied. Processing logic can determine that a level of confidence of the respective set of deposition process settings satisfies the level of confidence criterion responsive to a determination that the level of confidence exceeds a threshold level of confidence value. In some embodiments, a level of confidence for multiple sets of deposition process settings can exceed the threshold level of confidence value. In such embodiments, processing logic an determine that the level of confidence criterion is satisfied for a particular set of deposition process settings that has the highest level of confidence that exceeds the threshold level of confidence value. In response to determining the level of confidence criterion is not satisfied for any of the respective sets of deposition settings, method 500 ends. In response to determining the level of confidence criterion is satisfied for at least one of the one or more sets of deposition process settings, the processing logic identifies the respective set of deposition process settings that satisfies the level of confidence criterion.

At block 522, processing logic performs one or more operations of the deposition process in accordance with the respective set of deposition process settings. In some embodiments, the deposition process for the substrate can be associated with an initial set of deposition process settings. The processing logic can modify one or more of the initial process settings to correspond to one or more of the respective set of deposition process settings and perform the deposition process in accordance with the modified set of deposition process settings. In some embodiments, the processing logic can transmit, a request to modify the one or more initial deposition settings to correspond to the one or more deposition settings in the respective set of deposition process settings to a client device connected to the manufacturing system (e.g., client device 120). In response to receiving an instruction from the client device to modify the initial set of deposition settings in accordance with the request, processing logic can modify the initial set of deposition settings, as previously described.

Figures 6A, 6B, 6C:
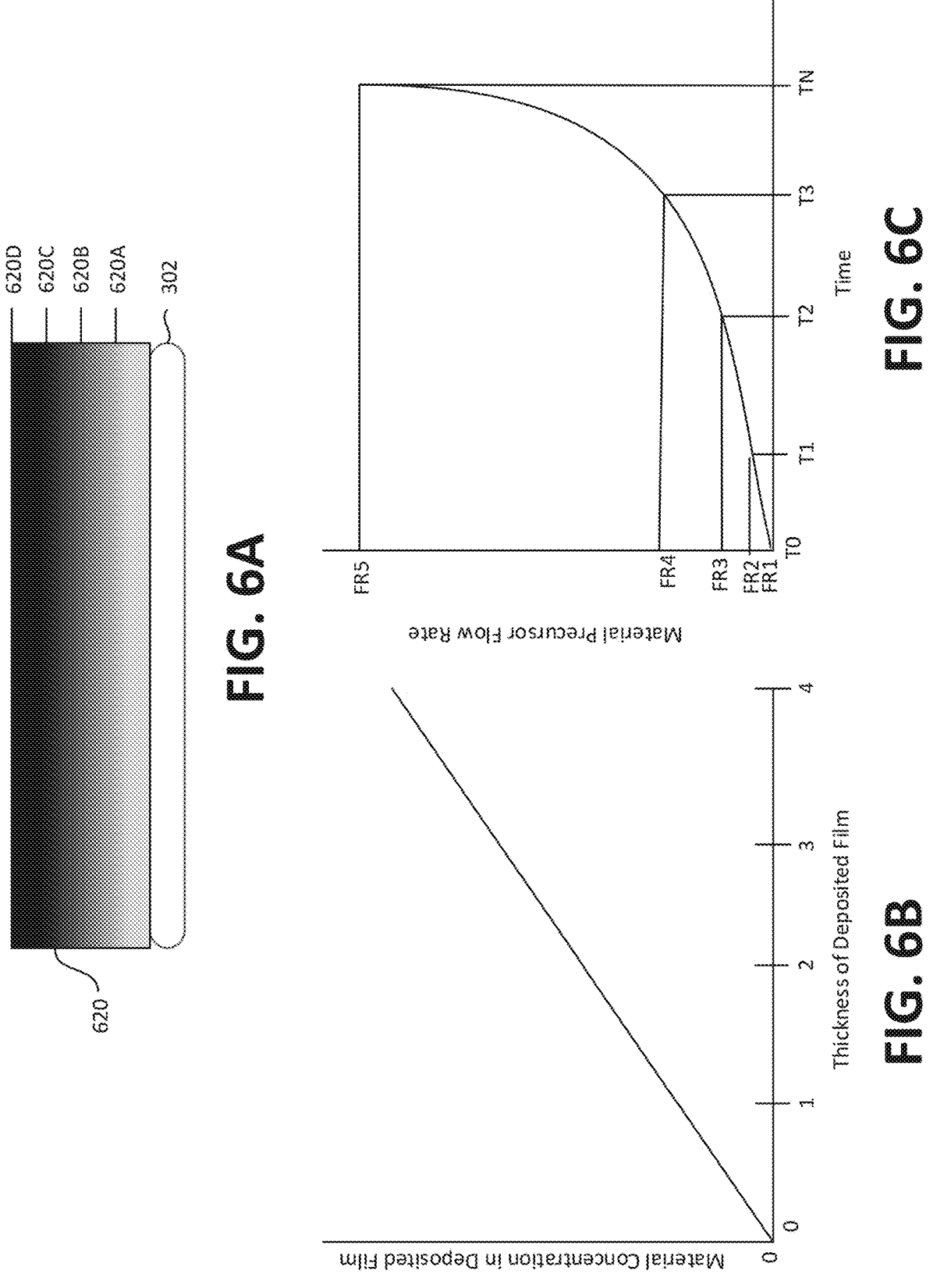
FIGS. 6A-6C illustrate depositing an example film having a target concentration profile on a surface of a substrate, according to aspects of the present disclosure.

FIGS. 6A-6C illustrate depositing an example film having a particular concentration profile on a surface of a substrate. FIG. 6A illustrates a film 620 deposited on a surface of a substrate 302. Film 620 includes a series of layers (e.g., layers 620A, 620B, 620C, 620D) formed on the substrate. Layer 620A is a first layer of material formed directly on the surface of substrate 302 (referred to as the proximal layer). Layer 620D is the final layer formed for the film at the end of the deposition process (referred to as the distal layer). Layers 620B and 620C are layers of material formed between proximal layer 620A and distal layer 620D. FIG. 6B is a graph that indicates the concentration of a particular material (e.g., boron, silicon,), in film 620 based on the thickness of film 620. Each layer 620A-D of film 620 corresponds to a particular thickness of film 620. For example, proximal layer 620A corresponds to thickness 1 of film 620, layer 620B corresponds to thickness 2, layer 620C corresponds to thickness 3, and distal layer 620D corresponds to thickness 4. As illustrated in FIGS. 6A and 6B, the concentration of the particular material increases linearly with the thickness of film 620, indicating that there is a lower concentration of the particular material in proximal layer 620A than there is in distal layer 620D.

In some embodiments, the concentration profile of film 620 can be a target concentration profile for a film to be deposited on a surface of substrate 302. As previously described, a user of a manufacturing system, (e.g., an operator) can provide data, via a client device, associated with the target concentration profile for film 620. For example, the user can provide an indication of the target thickness (e.g., thickness 4) of film 620, an indication of an initial concentration for the particular material in film 620 (e.g., the concentration of the particular material in proximal layer 620A), and a final concentration for the particular material in film 620 (e.g., the concentration of the particular material in distal layer 620D). A processing device of the manufacturing system can provide the data associated with the target concentration profile as input to a trained machine learning model. The processing device can obtain one or more outputs of the trained machine learning model and can identify, from the one or more outputs, a set of deposition settings having a likelihood of confidence that satisfies a confidence criterion, as previously described.

FIG. 6C depicts a graph illustrating example set of deposition settings for the target concentration profile for film 620. In some embodiments, the set of deposition settings illustrated in FIG. 6C can be a set of deposition settings that satisfies a level of confidence criterion, as previously described. The deposition process to deposit the film having the target concentration profile can begin at time T0 and end at time TN. As illustrated in FIG. 6C, the flow rate of a precursor for the particular material of film 620 is to increase at a nonlinear rate during the length of the deposition process (e.g., T0 to TN) in order to achieve the target concentration profile for film 620. The graph illustrates, for particular instances during the deposition process, a flow rate setting for the precursor for the target material (e.g., the boron-based precursor, the silicon-based precursor, etc.) that should be applied during the deposition process in order to deposit a film having a concentration profile that corresponds to the target concentration profile. For example, the graph indicates that, to deposit a film having a concentration profile corresponding to the target concentration profile, the initial flow rate of the precursor can be flowrate FR1. Between time TO and time T1, the flowrate of the precursor can increase from flowrate FR1 to flowrate FR2 at a first ramping rate. Between time T1 and time T2, the flowrate of the precursor can increase from flowrate FR2 to flowrate FR3 at a second ramping rate, and so on. The processing device can perform the deposition process to deposited film 620 on the surface of substrate 302 according to the settings illustrated in FIG. 6C to achieve the target concentration profile for film 620.

Figure 7:
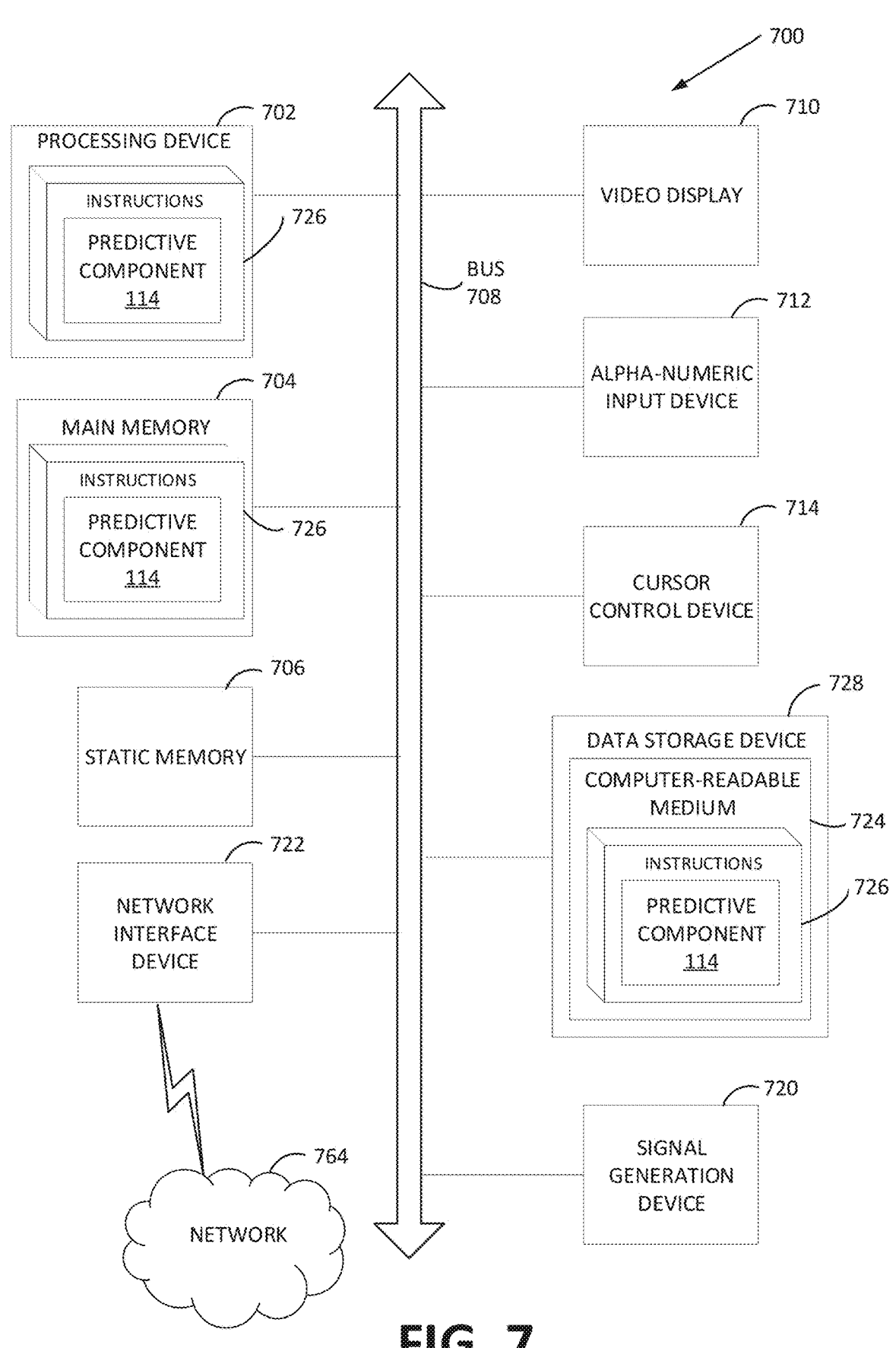
FIG. 7 depicts a block diagram of an illustrative computer system operating in accordance with one or more aspects of the present disclosure.

FIG. 7 depicts a block diagram of an illustrative computer system 700 operating in accordance with one or more aspects of the present disclosure. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 700 can correspond to system controller 328 of FIG. 3 or another processing device of computer system architecture 100.

The example computing device 700 includes a processing device 702, a main memory 704 (e.g., read-only memory (ROM), flash memory, dynamic random access memory (DRAM) such as synchronous DRAM (SDRAM), etc.), a static memory 706 (e.g., flash memory, static random access memory (SRAM), etc.), and a secondary memory (e.g., a data storage device 728), which communicate with each other via a bus 708.

Processing device 702 can represent one or more general-purpose processors such as a microprocessor, central processing unit, or the like. More particularly, the processing device 702 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. Processing device 802 can also be or include a system on a chip (SoC), programmable logic controller (PLC), or other type of processing device. Processing device 702 is configured to execute the processing logic for performing operations and steps discussed herein.

The computing device 700 can further include a network interface device 722 for communicating with a network 764. The computing device 800 also can include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 720 (e.g., a speaker).

The data storage device 728 can include a machine-readable storage medium (or more specifically a non-transitory computer-readable storage medium) 724 on which is stored one or more sets of instructions 726 embodying any one or more of the methodologies or functions described herein. Wherein a non-transitory storage medium refers to a storage medium other than a carrier wave. The instructions 726 can also reside, completely or at least partially, within the main memory 704 and/or within the processing device 702 during execution thereof by the computer device 700, the main memory 704 and the processing device 702 also constituting computer-readable storage media.

The computer-readable storage medium 724 can also be used to store model 190 and data used to train model 190. The computer readable storage medium 724 can also store a software library containing methods that call model 190. While the computer-readable storage medium 724 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:

identifying a target concentration profile for a film to be deposited on a surface of a substrate during a deposition process for the substrate at a process chamber of a manufacturing system, wherein the target concentration profile corresponds to a target concentration gradient of a particular material of the film in view of a target thickness of the film;

processing data of the target concentration profile using a model, wherein the model outputs a set of deposition process settings that corresponds to the target concentration profile; and performing one or more operations of the deposition process in accordance with the set of deposition process settings.

2. The method of claim 1, wherein processing the data of the target processing profile using the model comprises:

providing an indication of the target processing profile as input to the model;

obtaining one or more outputs of the model; and determining, from the one or more outputs, process recipe data identifying one or more sets of deposition process settings and, for each set of deposition process settings, an indication of a level of confidence that a respective set of deposition process settings corresponds to the target concentration profile for the film to be deposited on the substrate.

3. The method of claim 2, further comprising:

identifying the respective set of deposition process settings with a level of confidence that satisfies a level of confidence criterion.

4. The method of claim 2, further comprising:

providing, as an additional input to the model, a set of one or more process constraints associated with the deposition process.

5. The method of claim 1, wherein the target concentration gradient of the particular material is based on the target thickness for the film to be deposited on the surface of the substrate, a target initial concentration for the particular material of the film, and a target final concentration for the particular material of the film.

6. The method of claim 1, wherein each set of deposition process settings is associated with a concentration profile for the film deposited on the surface of the substrate, and wherein the set of deposition process settings corresponds to the target concentration responsive to a determination that a difference between the concentration profile associated with the set of deposition process settings and the target concentration profile is below a threshold difference value.

7. The method of claim 1, wherein the deposition process for the substrate is associated with an initial set of deposition process settings, and wherein performing one or more operations of the deposition process in accordance with the set of deposition process settings comprises modifying one or more of the initial set of deposition process settings to correspond to one or more of the set of deposition process settings.

8. The method of claim 7, further comprising:

transmitting, to a client device connected to the manufacturing system, a request to modify the one or more of the initial set of deposition process settings to correspond to the one or more of the set of deposition process settings; and receiving, from the client device, an instruction to modify the one or more of the initial set of deposition process settings to correspond to the one or more of the set of deposition settings, wherein the one or more of the initial set of deposition process settings are updated in accordance with the received instruction.

9. The method of claim 1, wherein the set of deposition process settings comprises at least one of: a temperature setting for the process chamber, a pressure setting for the process chamber, or a flow rate setting for a precursor for one or more materials of the film to be deposited on the surface of the substrate.

10. A system comprising:

a memory; and a processing device coupled to the memory, wherein the processing device is to perform operations comprising:

identifying a target concentration profile for a film to be deposited on a surface of a substrate during a deposition process for the substrate at a process chamber of a manufacturing system, wherein the target concentration profile corresponds to a target concentration gradient of a particular material of the film in view of a target thickness of the film;

processing data of the target concentration profile using a model, wherein the model outputs a set of deposition process settings that corresponds to the target concentration profile; and performing one or more operations of the deposition process in accordance with the set of deposition process settings.

11. The system of claim 10, wherein processing the data of the target processing profile using the model comprises:

providing an indication of the target processing profile as input to the model;

obtaining one or more outputs of the model; and determining, from the one or more outputs, process recipe data identifying one or more sets of deposition process settings and, for each set of deposition process settings, an indication of a level of confidence that a respective set of deposition process settings corresponds to the target concentration profile for the film to be deposited on the substrate.

12. The system of claim 11, wherein the operations further comprise:

identifying the respective set of deposition process settings with a level of confidence that satisfies a level of confidence criterion.

13. The system of claim 11, wherein the operations further comprise:

providing, as an additional input to the model, a set of one or more process constraints associated with the deposition process.

14. The system of claim 10, wherein the target concentration gradient of the particular material is based on target thickness for the film to be deposited on the surface of the substrate, a target initial concentration for the particular material of the film, and a target final concentration for the particular material of the film.

15. The system of claim 10, wherein each set of deposition process settings is associated with a concentration profile for the film deposited on the surface of the substrate, and wherein the set of deposition process settings corresponds to the target concentration responsive to a determination that a difference between the concentration profile associated with the set of deposition process settings and the target concentration profile is below a threshold difference value.

16. A non-transitory computer readable storage medium comprising instructions that, when executed by a processing device, cause the processing device to perform operations comprising:

identifying a target concentration profile for a film to be deposited on a surface of a substrate during a deposition process for the substrate at a process chamber of a manufacturing system, wherein the target concentration profile corresponds to a target concentration gradient of a particular material of the film in view of a target thickness of the film;

processing data of the target concentration profile using a model, wherein the model outputs a set of deposition process settings that corresponds to the target concentration profile; and performing one or more operations of the deposition process in accordance with the set of deposition process settings.

17. The non-transitory computer readable storage medium of claim 16, wherein processing the data of the target processing profile using the model comprises:

providing an indication of the target processing profile as input to the model;

obtaining one or more outputs of the model; and determining, from the one or more outputs, process recipe data identifying one or more sets of deposition process settings and, for each set of deposition process settings, an indication of a level of confidence that a respective set of deposition process settings corresponds to the target concentration profile for the film to be deposited on the substrate.

18. The non-transitory computer readable storage medium of claim 17, wherein the operations further comprise:

identifying the set of deposition process settings with a level of confidence that satisfies a level of confidence criterion.

19. The non-transitory computer readable storage medium of claim 17, wherein the operations further comprise:

providing, as an additional input to the model, a set of one or more process constraints associated with the deposition process.

20. The non-transitory computer readable storage medium of claim 16, wherein the target concentration gradient of the particular material is based on the target thickness for the film to be deposited on the surface of the substrate, a target initial concentration for the particular material of the film, and a target final concentration for the particular material of the film.

* * * * *